(12) United States Patent
Cai et al.

(10) Patent No.: US 10,244,620 B2
(45) Date of Patent: Mar. 26, 2019

(54) CIRCUIT BOARD AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Liwen Cai, Beijing (CN); Xianzhen Tang, Beijing (CN); Dingwei Zhang, Beijing (CN); Liang Chen, Beijing (CN); Ben Guo, Beijing (CN); Lei Xu, Beijing (CN); Fei Fang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/272,608

(22) Filed: Sep. 22, 2016

(65) Prior Publication Data

US 2017/0118840 A1     Apr. 27, 2017

(30) Foreign Application Priority Data

Oct. 27, 2015     (CN) .......................... 2015 1 0707558

(51) Int. Cl.
| | |
|---|---|
| *H05K 1/02* | (2006.01) |
| *H05K 1/11* | (2006.01) |
| *H05K 1/14* | (2006.01) |
| *H05K 3/32* | (2006.01) |

(52) U.S. Cl.
CPC ......... *H05K 1/0274* (2013.01); *H05K 1/0269* (2013.01); *H05K 1/118* (2013.01); *H05K 1/117* (2013.01); *H05K 1/147* (2013.01); *H05K 3/323* (2013.01); *H05K 2201/0108* (2013.01);
(Continued)

(58) Field of Classification Search
USPC ......................................................... 361/767
See application file for complete search history.

(56) References Cited

U.S. PATENT DOCUMENTS

| | | | |
|---|---|---|---|
| 2004/0183484 A1 | 9/2004 | Ide et al. | |
| 2011/0063274 A1* | 3/2011 | Kim ..................... | G09G 3/3406 345/211 |

(Continued)

FOREIGN PATENT DOCUMENTS

| | | |
|---|---|---|
| CN | 1645985 A | 7/2005 |
| CN | 104102383 A | 10/2014 |

OTHER PUBLICATIONS

The First Chinese Office Action dated Jul. 4, 2017; Appln. No. 201510707558.8.

*Primary Examiner* — Andargie M Aychillhum
(74) *Attorney, Agent, or Firm* — Ladas & Parry LLP

(57) ABSTRACT

A circuit board and a display device are disclosed. The circuit board is configured to be bonded onto a display substrate; the circuit board includes a bonding connection end, which includes a base film and a plurality of first connecting terminals disposed on the base film; regions, which are corresponding to at least part of the first connecting terminals, of the base film comprises a transparent membrane material. The circuit board improves the product quality monitoring level during the bonding process, and decreases the product risks.

20 Claims, 3 Drawing Sheets

(52) U.S. Cl.
CPC .............. *H05K 2201/09781* (2013.01); *H05K 2201/10128* (2013.01)

(56) References Cited

U.S. PATENT DOCUMENTS

| | | | |
|---|---|---|---|
| 2012/0256199 A1* | 10/2012 | Lee | G02F 1/13452 257/88 |
| 2015/0241906 A1* | 8/2015 | Tsai | G06F 3/044 345/173 |
| 2016/0252987 A1 | 9/2016 | Wang | |

* cited by examiner

CIRCUIT BOARD AND DISPLAY DEVICE

TECHNICAL FIELD

Embodiments of the present disclosure relate to a circuit board and a display device.

BACKGROUND

Bonding process is generally adopted in the display technology field; for example, flexible printed circuit boards, which are disposed at the perimeter of a display panel, are bonded onto a display substrate (for example, an array substrate or a color filter substrate) of the display panel.

Influencing factors such as temperature, pressure and time in the bonding process can cause differences in product quality. Influencing factors can vary because of the equipment stability and the material accuracy during the product manufacture process, and then fluctuation of the product quality can be caused, and therefore, a monitoring process should be adopted to ensure the product quality.

Currently, both chips (for example, COG (Chip-On-Glass)) and peripheral circuit board (for example, FOG (FPC-On-Glass)) can be bonded onto a display substrate through the bonding process conducted on an array substrate. Because the array substrate can transmit light or partially transparent, the bonding status of COG/FOG can be easily monitored.

SUMMARY

An embodiment of the present disclosure provides a circuit board, which is configured for bonding onto a display substrate; the circuit board comprising a bonding connection end, which comprises a base film and a plurality of first connecting terminals disposed on the base film, regions, which are corresponding to at least part of the first connecting terminals, of the base film comprise a transparent membrane material.

Another embodiment of the present disclosure provides a display device, the display device comprising a display substrate and the above circuit board, which is bonded onto the display substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make those skilled in the art have a better understanding of the technical solutions of the present disclosure, in the following, a circuit board and a display device provided by the present disclosure will be described in detail with reference to accompany drawings and embodiments.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
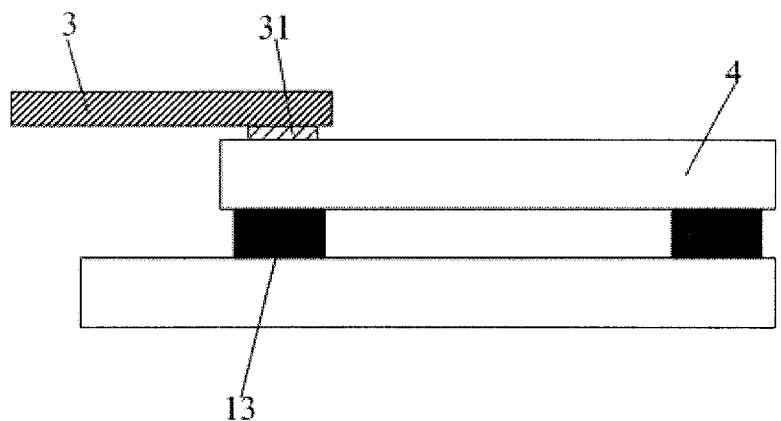
FIG. 1 is a structural cross-sectional view of a peripheral circuit board bonded onto a color filter substrate.

A peripheral circuit board 3 of an on-cell type touch control screen is generally bonded onto a color filter substrate 4 (FPC-On-CF Glass), and a bonding terminal 31 of the peripheral circuit board 3 is correspondingly located above the black matrix (BM) 13, as illustrated in FIG. 1. Because the black matrix 13 regions cannot transmit light, the bonding status of the bonding terminal 31 of the peripheral circuit board 3 on the color filter substrate cannot be observed under a microscope.

In order to monitor the bonding status of the peripheral circuit board on the color filter substrate so as to decrease the product risks and improve the product quality, the following methods can be adopted.

Method one includes: detaching the color filter substrate and the array substrate after cell assembly from each other, removing the black matrix on the color filter substrate, and then observing the bonding status through a microscope. The above method for monitoring the bonding status has the following disadvantages: (1) the cost is high; (2) much time is needed in detaching the color filter substrate and the array substrate, therefore, the monitor frequency is seriously inadequate; (3) the safety factor is low.

Method two includes: detaching the peripheral circuit board after the bonding process is finished and then observing the bonding status with a microscope; the above method for monitoring the bonding status has the following disadvantages: (1) the cost is high; (2) the method can only monitor the distortion status of metal ball particles, the method cannot monitor whether bubbles exist in the bonding glue, and neither can the method monitor whether the corresponding connecting terminals are coincided with each other.

Method three includes: forming a slit or window on the black matrix film on the color filter substrate, the slit or window can allow light to pass therethrough after the slit or window is formed, therefore, the bonding status can be directly observed under microscope, the above method has the following disadvantages: (1) rubbing mura can be caused during forming the slit or window; (2) the slit or window can cause a light leakage. Because a concave portion is formed on the black matrix film due to the formed slit or window, the rubbing mura can be easily caused during forming an alignment layer through rubbing.

To solve the technical problems existing in the above-mentioned method, the embodiments of the present disclosure provides a circuit board and a display device. The circuit board comprises a transparent membrane material at regions, which are corresponding to part or all of the first connecting terminals, of the base film of the bonding connection end; and therefore the product quality monitoring level during the bonding process is improved, the product risks are decreased, and the product quality is improved without affecting the structure and the optoelectronic characteristics of the products after bonding.

First Embodiment

Figure 2:
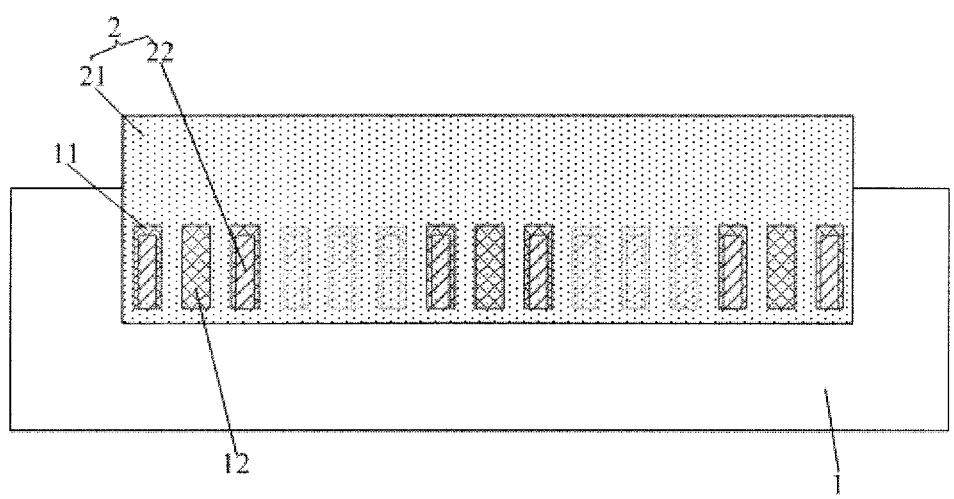
FIG. 2 is a structural plan view of a circuit board bonded onto a display substrate provided by a first embodiment.

As illustrated in FIG. 2, the present embodiment of the present disclosure provides a circuit board, which is configured for being bonded onto a display substrate 1; the display substrate 1 comprises a bonding connection end 2, which comprises a base film 21 and a plurality of first connecting terminals 22 disposed on the base film 21; regions, which are corresponding to part of the first connecting terminals 22, of the base film 21 comprise a transparent membrane material. The regions, which are corresponding to part of the first connecting terminals 22, of the base film 21 comprise the transparent membrane material for example. In this way, part of the first connecting terminals 22 can be observed through the above transparent membrane material from a side of the base film 21.

For example, the circuit board can adopt a multilayer structure; at least one layer of the multilayer structure is a transparent layer 111, for example, the layer immediately adjacent to the first connecting terminals 22 is a transparent layer 111; at least one layer of the multilayer structure is an opaque layer 112, and the regions, which corresponding to the locations that need monitoring, of the opaque layer 112 should be removed to leave a window or windows, and then the locations to be monitored can be observed through the transparent layer 111 through the formed window(s).

In the case of bonding the circuit board onto the display substrate 1, bonding glue (for example, anisotropy conductive adhesive) is applied (e.g., coated) in a bonding region of the display substrate, the connection terminal (for example, a contacting pad) on the display substrate 1 is aligned with the first connecting terminal 22 of the circuit board, and then the circuit board is bonded onto the display substrate 1 by pressing.

Because the regions, which are corresponding to part of the first connecting terminals 22, of the base film 21 of the bonding connection end 2 comprise the transparent membrane material, the bonding status can be directly observed through the transparent region of the base film 21 with the bonding connection end 2 staying in the state of being bonded, and thus more conveniently and effectively monitoring for the following factors after bonding process is finished can be realized: changing status of the electrically conductive particles (for example, metal ball particles) in the anisotropy conductive adhesive, overlapping condition of the first connecting terminal 22 on the bonding connection end 2 and the second connecting terminal 11 on the display substrate 1, and bubbles in the bonding glue; therefore, the circuit board improves the product quality monitoring level during the bonding process without affecting the structure and the optoelectronic characteristics of the products after bonding.

In the present embodiment, for example the plurality of first connecting terminals 22 are arranged in a row, the regions, which are corresponding to the first connecting terminals 22 located at the center position and both ends of the row, of the base film 21 comprise the transparent membrane material, and then a transparent region is formed. That is to say, more conveniently and effectively monitoring of the following factors can be realized through monitoring the bonding status of the first connecting terminals 22 at different positions in the row of first connecting terminals 22: the changing status of the electrically conductive particles after the first connecting terminal 22 is bonded; the overlapping condition of the first connecting terminal 22 on the bonding connection end 2 and the second connecting terminal 11 on the display substrate 1; and the bubbles in the bonding glue. Meanwhile, the monitoring process will not affect the structure and the optoelectronic characteristics of the products after bonding. Furthermore, the center position and both ends of the bonding region are typical and representative, and therefore, the bonding status of the above positions can reflect the bonding status of the whole bonding region to a great extent.

In the present embodiment, for example the center position and both ends of the row of the base film 21 each are provided with two first connecting terminals 22, respectively; in this way, the bonding overlapping condition between the two first connecting terminals 22 and the two second connecting terminals 11 can be observed through sampling; the two first connecting terminals 22 are configured to be bonded with the two second connecting terminals 11 of the display substrate 1, respectively; the spacing region between the two first connecting terminals 22 is bonded with a third connecting terminal 12, which is disposed at the spacing region between the two second connecting terminals 11. In this way, the bonding overlapping condition between the two first connecting terminals 22 and the two second connecting terminals 11 can be observed through the base film 21, at the center position and both ends of the row of first connecting terminal 22 respectively; meanwhile, the changing status of the electrically conductive particles, and the generation and distribution of the bubbles in the bonding glue can be observed through the base film 21 corresponding to the third connecting terminal 12; therefore, the product quality monitoring level during the bonding process is improved, the product risks are decreased, and the product quality is improved.

The third connecting terminal 12 is grounded or suspended for example. Because the third connecting terminals 12 on the display substrate 1 are not bonded with any of the first connecting terminals 22, i.e., the third connecting terminals 12 will be not input or output any signals, the third connecting terminal 12 do not have the function of inputting or outputting signals; therefore, the third connecting terminal 12 is grounded or suspended, so as to avoid the adverse influence caused by wrong introduction of signals to the display substrate 1 or the circuit board.

Figure 3:
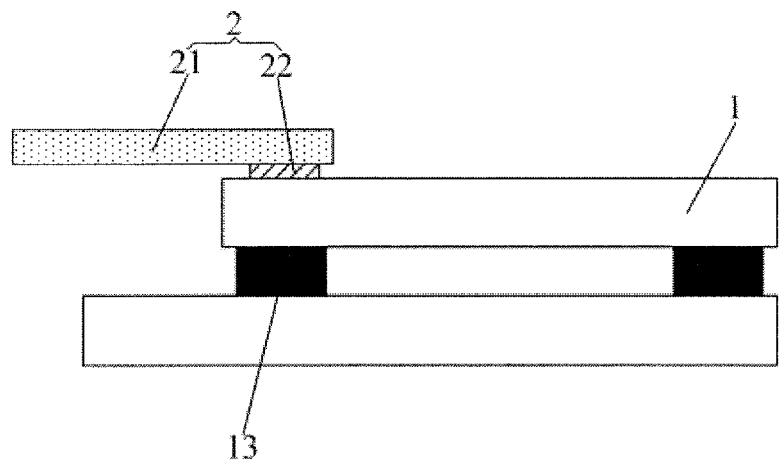
FIG. 3 is a structural cross-sectional view of the circuit board bonded onto the display substrate shown in FIG. 2.

In the present embodiment, as illustrated in FIG. 3, the display substrate 1 is the color filter substrate for example. The first connecting terminal 22 are configured corresponding to the black matrix 13 on the color filter substrate. The circuit board in the present embodiment is the peripheral circuit board of the touch control panel, the touch control panel is an on-cell type, and therefore, the peripheral circuit board should be bonded with the color filter substrate. The bonding region on the color filter substrate is located at the region where the black matrix 13 located, because the black matrix 13 cannot transmit light, the bonding status of the circuit board and color filter substrate cannot be observed from a side of the color filter substrate after the first connecting terminal 22 is bonded with the color filter substrate, and the bonding status of the circuit board and color filter substrate can only be observed through the transparent base film 21 on the bonding connection end 2 of the circuit board.

It should be understood that the display substrate 1 can also be an array substrate. The black matrix generally is not disposed on the array substrate compared with the color filter substrate; because the array substrate can transmit light, the bonding status can be observed through the base film 21 and/or the array substrate when the circuit board is bonded with the array substrate.

In the present embodiment, the region with the transparent membrane material and other regions employing another material can have the same thermal resistance. In this way, the thermal expansion coefficient of different regions on the base film 21 can be the same or consistent with each other, and therefore the bonding failure caused by the temperature difference between the regions with different materials can be avoided.

Second Embodiment

Figure 4:
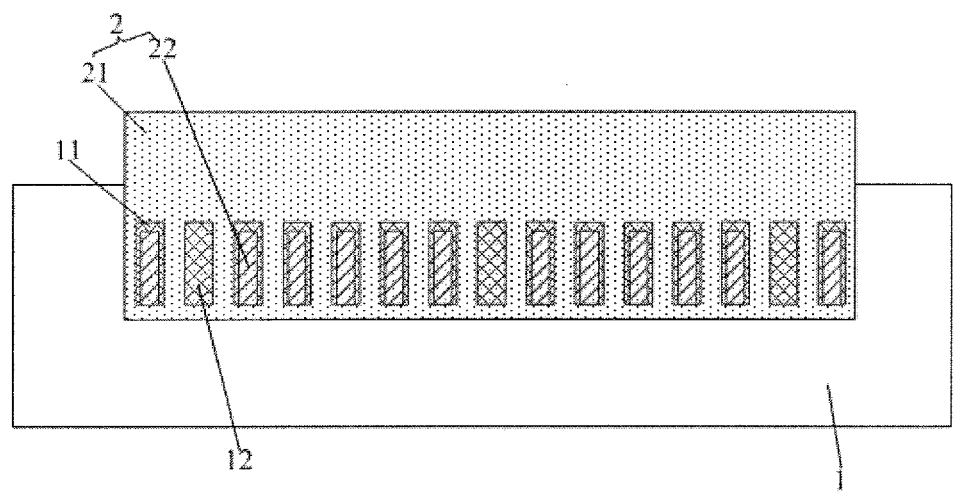
FIG. 4 is a structural plan view of a circuit board bonded onto a display substrate provided by a second embodiment.
Figure 5:
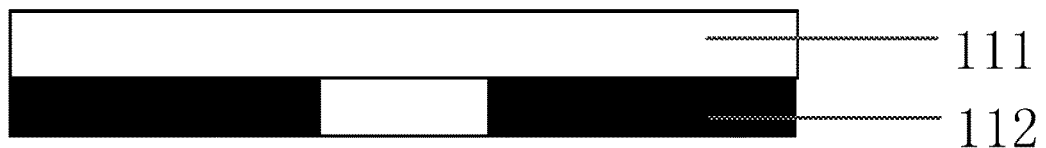
FIG. 5 is a schematic diagram of a multilayer structure.

The present embodiment of the present disclosure provides a circuit board, as illustrated in FIG. 4, what is in difference from the first embodiment is as follows: the plurality of first connecting terminals 22 are arranged in a row, and all regions, which are corresponding to the row of first connecting terminals 22, of the base film 21 are employ the transparent membrane material, and then a transparent region can be formed.

In this way, the bonding status between all of the first connecting terminals 22 and the second connecting terminals 11 on the display substrate 1 can be observed through the base film 21, and then the bonding status of each of the bonding connection terminals can be observed, therefore, the product quality monitoring level during the bonding process can be further improved, the products risk can be further decreased, and the product quality can be further improved.

In the present embodiment, the row of the first connecting terminals 22 are configured for correspondingly being bonded with the row of second connecting terminals 11 on the display substrate 1; a third connecting terminal or terminals 12 are further disposed in part of the spacing regions of the row of second connecting terminals 11, the third connecting terminal or terminals 12 are correspondingly bonded onto part of the spacing regions of the row of the first connecting terminals 22. Correspondingly bonding of the third connecting terminal or terminals 12 and the spacing region(s) between the first connecting terminals 22 are mainly for observing the changing status of the electrically conductive particles after the bonding process and the status of bubble generation and distribution in the bonding glue; therefore, the product quality monitoring level during the bonding process can be further improved, the product risks can be further decreased, and the product quality can be further improved.

The third connecting terminal 12 is grounded or suspended for example; the reason and technical effect of such configuration can refer to the first embodiment.

Other structures of the circuit board provided by the present embodiment are the same as the first embodiment; no further description will be given herein.

The circuit boards provided by the first embodiment and the second embodiment employ a transparent membrane material at regions, which are corresponding to part or all of the first connecting terminals, of the base film of the bonding connection end, and then the bonding status can be directly observed through the transparent region(s) of the base film with the bonding connection end staying in the state of being bonded; therefore, more conveniently and effectively monitoring of the following factors after bonding process is finished can be realized: the changing status of the electrically conductive particles, the overlapping condition of the first connecting terminal on the bonding connection end and the second connecting terminal on the display substrate, and the bubbles in the bonding glue; therefore, the product quality monitoring level during the bonding process is improved, the product risks are decreased, and the product quality is improved without affecting the structure and the optoelectronic characteristics of the bonding products.

Third Embodiment

The present embodiment of the present disclosure provides a display device, which comprises any of the circuit boards in the first and second embodiments. The product quality monitoring level during the bonding process is improved, the product risks are decreased, and the product quality is improved without affecting the structure and the optoelectronic characteristics of the bonding products.

The display device provided can be any products or device that has display function, such as a cell phone, a tablet computer, a television, a display screen, a laptop, a digital photo frame, a navigator, and so on.

What are described above is related to the illustrative embodiments of the disclosure only and not limitative to the scope of the disclosure; the scopes of the disclosure are defined by the accompanying claims.

The application claims priority to the Chinese patent application No. 201510707558.8, filed on Oct. 27, 2015, the entire disclosure of which is incorporated herein by reference as part of the present application.

What is claimed is:

1. A circuit board, which is configured for being bonded onto a display substrate, comprising:
   a bonding connection end, which comprises a base film and a plurality of first connecting terminals disposed on the base film,
   wherein, regions, which are corresponding to at least part of the first connecting terminals, of the base film comprise a transparent membrane material;
   the circuit board further comprises a multilayer structure, at least one layer of the multilayer structure is a transparent layer, at least one layer of the multilayer structure is an opaque layer, and the region, which is corresponding to at least one first connecting terminal, of the opaque layer is removed.

2. The circuit board according to claim 1, wherein, the plurality of first connecting terminals are arranged in a row, the regions, which are corresponding to the first connecting terminals located at a center position and both ends of the row, of the base film comprise the transparent membrane material.

3. The circuit board according to claim 2, wherein, the center position and both ends of the row of the first connecting terminals on the base film are each provided two first connecting terminals, respectively, and the two first connecting terminals are bonded with two second connecting terminals of the display substrate, respectively.

4. The circuit board according to claim 3, wherein, a spacing region between the two first connecting terminals are bonded with a third connecting terminal, which is disposed at a spacing region between the two second connecting terminals.

5. The circuit board according to claim 1, wherein, the plurality of first connecting terminals are arranged in a row, and all regions, which are corresponding to the row of the first connecting terminals, of the base film comprise the transparent membrane material.

6. The circuit board according to claim 5, wherein, the row of the first connecting terminals are configured to be correspondingly bonded with a row of second connecting terminals on the display substrate; third connecting terminals are further disposed at part of spacing regions of the row of the second connecting terminals, the third connecting terminals are configured to be correspondingly bonded onto part of spacing regions of the row of the first connecting terminals.

7. The circuit board according to claim 1, wherein, the display substrate is an array substrate or a color filter substrate.

8. The circuit board according to claim 7, wherein, the first connecting terminals are corresponding to a black matrix of the color filter substrate.

9. The circuit board according to claim 1, wherein, the regions comprising the transparent membrane material and other regions comprising another material have same thermal resistance.

10. A display device, comprising a display substrate and the circuit board according to claim 1, wherein the circuit board is bonded onto the display substrate.

11. The display device according to claim 10, wherein, the display substrate is an array substrate or a color filter substrate.

12. The display device according to claim 11, wherein, the first connecting terminals are corresponding to a black matrix of the color filter substrate.

13. The display device according to claim 10, wherein, the plurality of first connecting terminals are arranged in a row, the regions, which are corresponding to the first connecting terminals located at a center position and both ends of the row, of the base film comprise the transparent membrane material.

14. The display device according to claim 13, wherein, the center position and both ends of the row of the first connecting terminals on the base film have two first connecting terminals, respectively, and the two first connecting terminals are bonded with two second connecting terminals of the display substrate, respectively.

15. The display device according to claim 14, wherein, a spacing region between the two first connecting terminals are bonded with a third connecting terminal, which is disposed at a spacing region between the two second connecting terminals.

16. The display device according to claim 15, wherein, the third connecting terminal is grounded or suspended.

17. The display device according to claim 16, wherein, the row of first connecting terminals are configured to be correspondingly bonded with a row of second connecting terminals on the display substrate; third connecting terminals are further disposed at part of spacing regions of the row of the second connecting terminals, the third connecting terminals are correspondingly bonded onto part of spacing regions of the row of the first connecting terminals.

18. The circuit board according to claim 1, wherein the transparent layer is closer to the first connecting terminal compared to the opaque layer.

19. The circuit board according to claim 1, wherein each of the first connecting terminals is in a strip shape; and the plurality of first connecting terminals have same one extension direction.

20. The circuit board according to claim 1, wherein the plurality of first connecting terminals are separated from and insulated with each other;

the plurality of first connecting terminals are arranged in a row, the regions, which are corresponding to the first connecting terminals located at a center position and both ends of the row, of the base film comprise the transparent membrane material;

the center position and both ends of the row of the first connecting terminals on the base film are each provided two first connecting terminals, respectively, and the two first connecting terminals are bonded with two second connecting terminals of the display substrate, respectively;

an orthographic projection of each of the first connecting terminals on the display substrate is within an orthographic projection of a corresponding second connecting terminal on the display substrate; and an extension direction of each of the first connecting terminals and an extension direction of each of the second connecting terminals are same.

* * * * *